(12) United States Patent
Son et al.

(10) Patent No.: US 10,319,619 B2
(45) Date of Patent: Jun. 11, 2019

(54) EQUIPMENT FOR MANUFACTURING SEMICONDUCTOR DEVICES AND METHOD FOR USE OF SAME FOR MANUFACTURING SEMICONDUCTOR PACKAGE COMPONENTS

(71) Applicants: Samsung Electronics Co., Ltd., Suwon-si, Gyeonggi-do (KR); BongJin Son, Asan-si (KR); Yose Eum, Cheonan-si (KR); JangWoo Lee, Asan-si (KR)

(72) Inventors: BongJin Son, Asan-si (KR); Yose Eum, Cheonan-si (KR); JangWoo Lee, Asan-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 2 days.

(21) Appl. No.: 15/528,620

(22) PCT Filed: Dec. 5, 2014

(86) PCT No.: PCT/IB2014/066623
§ 371 (c)(1),
(2) Date: May 22, 2017

(87) PCT Pub. No.: WO2016/087904
PCT Pub. Date: Jun. 9, 2016

(65) Prior Publication Data
US 2017/0263596 A1    Sep. 14, 2017

(51) Int. Cl.
*H01L 21/67* (2006.01)
*H01L 21/683* (2006.01)
(Continued)

(52) U.S. Cl.
CPC .. *H01L 21/67138* (2013.01); *H01L 21/67005* (2013.01); *H01L 21/67011* (2013.01);
(Continued)

(58) Field of Classification Search
CPC ......... H01L 21/67005; H01L 21/67011; H01L 21/67121; H01L 21/67138;
(Continued)

(56) References Cited

U.S. PATENT DOCUMENTS 5,927,589 A      7/1999  Yang
5,984,165 A  *  11/1999  Inoue ................... B23K 1/0056
                                                           219/209
(Continued)

FOREIGN PATENT DOCUMENTS

CN      103567683 A    2/2014
CN      103962772 A    8/2014
KR      2011/0097518 A 8/2011

OTHER PUBLICATIONS

George Wenger et al., "Double Reflow-Induced Brittle Interfacial Failures in Pb-free Ball Grid Array Solder Joints", As originally published in the IPC APEX Expo Conference Proceedings.
(Continued)

*Primary Examiner* — Eduardo A Rodela
(74) *Attorney, Agent, or Firm* — Harness, Dickey & Pierce, P.L.C.

(57) ABSTRACT

Provided are an apparatus for manufacturing a semiconductor device and a method of manufacturing a semiconductor package using the same. The manufacturing apparatus may include a base with a plurality of through holes and weight blocks respectively bound by the through holes.

12 Claims, 14 Drawing Sheets

(51) Int. Cl.
*H01L 21/687* (2006.01)
*H01L 23/00* (2006.01)
*H01L 25/065* (2006.01)
*H01L 25/00* (2006.01)
*H01L 25/10* (2006.01)

(52) U.S. Cl.
CPC .. *H01L 21/67092* (2013.01); *H01L 21/67121* (2013.01); *H01L 21/67144* (2013.01); *H01L 21/683* (2013.01); *H01L 21/687* (2013.01); *H01L 21/6835* (2013.01); *H01L 24/11* (2013.01); *H01L 24/17* (2013.01); *H01L 25/0657* (2013.01); *H01L 25/105* (2013.01); *H01L 25/50* (2013.01); *H01L 24/16* (2013.01); *H01L 24/73* (2013.01); *H01L 2224/11849* (2013.01); *H01L 2224/16227* (2013.01); *H01L 2224/73253* (2013.01); *H01L 2225/1023* (2013.01); *H01L 2225/1058* (2013.01); *H01L 2225/1094* (2013.01); *H01L 2924/15311* (2013.01); *H01L 2924/15331* (2013.01); *H01L 2924/18161* (2013.01); *H01L 2924/3511* (2013.01)

(58) Field of Classification Search
CPC ............. H01L 21/67144; H01L 21/683; H01L 21/6835; H01L 21/6838; H01L 21/687
See application file for complete search history.

(56) References Cited

U.S. PATENT DOCUMENTS

| | | | | |
|---|---|---|---|---|
| 6,240,634 | B1* | 6/2001 | Kira | H01L 21/563 228/180.21 |
| 6,267,650 | B1* | 7/2001 | Hembree | B24B 7/22 257/E21.508 |
| 6,543,668 | B1* | 4/2003 | Fujii | B23K 20/023 228/103 |
| 8,304,290 | B2 | 11/2012 | Graf et al. | |
| 8,317,077 | B2* | 11/2012 | Hwang | B23K 1/0012 228/39 |
| 8,381,966 | B2 | 2/2013 | Kumar et al. | |
| 9,698,088 | B2* | 7/2017 | Kwon | H01L 23/49816 |
| 2006/0292756 | A1 | 12/2006 | Primavera et al. | |
| 2007/0257360 | A1 | 11/2007 | Clemons et al. | |
| 2008/0157353 | A1 | 7/2008 | Watanabe et al. | |
| 2008/0159353 | A1 | 7/2008 | Bosselmann et al. | |
| 2009/0023243 | A1* | 1/2009 | Koyanagi | H01L 21/568 438/107 |
| 2009/0289101 | A1 | 11/2009 | Du et al. | |
| 2011/0147066 | A1 | 6/2011 | Sidhu et al. | |
| 2011/0176280 | A1* | 7/2011 | Lee | H01L 25/16 361/721 |
| 2012/0091597 | A1 | 4/2012 | Kwon et al. | |
| 2012/0159118 | A1 | 6/2012 | Wong et al. | |
| 2012/0286417 | A1 | 11/2012 | Lin et al. | |
| 2012/0309187 | A1 | 12/2012 | Sri-Jayantha et al. | |
| 2013/0273194 | A1 | 10/2013 | Chou | |

OTHER PUBLICATIONS

Ser Choong Chong et al., "Assembly Challenges of High Density Large Fine Pitch Lead-Free Flip Chip Package", 2006 Electronic Components and Technology Conference, p. 10-15.
Dudi Amir et al., "The Challenges of Non Wet Open BGA Solder Defect", p. 684-694.
Kirk Van Dreel, "FCBGA Package Warpage Definition Stage Project", May 28, 2013.
Laura Frisk, "Study of Structure and Failure Mechanisms in ACA Interconnections Using SEM", Scanning Electron Microscopy, p. 491-517.
Niranjan Vijayaragavan et al.,"Package on Package Warpage—Impact on Surface Mount Yields and Board Level Reliability", 2008 Electronic Components and Technology Conference, p. 389-396.
Michael Chen et al., "TI OMAP4xxx POP SMT Design Guideline".
"M40 & M46 SP series that enables maximum cost reduction", Senju Metal Industry Co.
International Search Report PCT/ISA/210 for International Application No. PCT/IB2014/066623 dated May 15, 2015.
Julie Silk et al., "Double Reflow-Induced Brittle Interfacial Failures in Pb-free Ball Grid Array Solder Joints", As originally published in the IPC APEX Expo Conference Proceedings.

* cited by examiner

EQUIPMENT FOR MANUFACTURING SEMICONDUCTOR DEVICES AND METHOD FOR USE OF SAME FOR MANUFACTURING SEMICONDUCTOR PACKAGE COMPONENTS

CROSS-REFERENCE TO RELATED APPLICATIONS

This application is a national phase under 35 U.S.C. § 371 of PCT International Application No. PCT/IB2014/066623 which has an International filing date of Dec. 5, 2014 the entire contents of each of which are hereby incorporated by reference.

TECHNICAL FIELD

The inventive concepts described herein relate to an apparatus for manufacturing a semiconductor device and a method of manufacturing a semiconductor package using the same, and in particular, to an apparatus for manufacturing a package-on-package device and a method of manufacturing a package-on-package device using the apparatus.

BACKGROUND ART

Due to their small-size, multifunctionality, and/or low-cost characteristics, semiconductor devices are considered important elements in the electronic industry. The semiconductor devices can be generally classified into a memory device for storing data, a logic device for processing data, and a hybrid device capable of performing various functions.

Higher integration and higher speed of semiconductor devices is required to satisfy consumer demands for electronic devices with a high density and a fast speed. Further, there is an increasing demand for a thin semiconductor package, but such a reduction in thickness of the semiconductor package leads to a technical issue such as package warpage. A variety of studies are being conducted to meet such requirements and overcome the technical issue.

DISCLOSURE

Technical Problem

Example embodiments of the inventive concept provide an apparatus for manufacturing a high-density semiconductor device.

Other example embodiments of the inventive concept provide a method of manufacturing a semiconductor package using the apparatus.

Technical Solution

According to example embodiments of the inventive concept, an apparatus for manufacturing a semiconductor device may include a base with a plurality of through holes and weight blocks respectively bound by the through holes.

In example embodiments, each of the weight blocks may include a lower part configured to be vertically movable in a corresponding one of the through holes, and an upper part extending from the lower part.

In example embodiments, the lower part may have a vertical length that is greater than that of the through hole.

In example embodiments, the lower part of each of the weight blocks may include a detent formed on a side surface thereof, and the base may include protrusions, each of which protrudes toward a center of a corresponding one of the through holes. The weight blocks may be engaged with the through holes, respectively, by the detents and the protrusions.

In example embodiments, the lower part of each of the weight blocks may include a recessed region formed on a side surface thereof to have a bottom-open and top-closed structure.

In example embodiments, the recessed region may have a thickness that is smaller than that of the lower part of each of the weight blocks.

In example embodiments, the apparatus may further include a plate with holes, in which the upper parts of the weight blocks are disposed.

In example embodiments, each of the weight blocks may include a vertical part penetrating a corresponding one of the through holes and having a first width, an upper part connected to a top of the vertical part and disposed on a top surface of the base, the upper part having a second width greater than the first width, and a lower part connected to a bottom of the vertical part and disposed below a bottom surface of the base, the lower part having a third width greater than the first width.

In example embodiments, the third width may be greater than the second width.

In example embodiments, each of the weight blocks may have a bottom surface to be in direct contact with a pressure-applying surface, and the bottom surface of each of the weight blocks may be configured to have a protrusion at a center region thereof.

In example embodiments, each of the weight blocks may have a bottom surface to be in direct contact with a pressure-applying surface, and the bottom surface of each of the weight blocks may be configured to have a protrusion at an edge region thereof.

In example embodiments, the base may include a material having a deformation-free property under a thermal process to be performed at a temperature of about 300° C.

In example embodiments, the base may include a rectangle-shaped outer portion with two pairs of opposite bars, and connecting portions, each of which connects each pair of opposite bars of the outer portion. The through holes may be provided to penetrate the connecting portions, respectively.

According to example embodiments of the inventive concept, a method of manufacturing a semiconductor package may include preparing first packages, each of which includes first connection patterns, disposing second packages on the first packages, respectively, each of the second packages including second connection patterns at positions corresponding to the first connection patterns, disposing a base with weight blocks, on the second packages, applying a pressure to all of the second packages using the weight blocks, and performing a reflow process on the first and second connection patterns to form a connection structure electrically connecting the first and second packages to each other.

In example embodiments, the applying of the pressure to the second packages may be performed in such a way that a weight of each of the weight blocks is exerted on a central region of a corresponding one of the second packages.

In example embodiments, the applying of the pressure to the second packages may be performed in such a way that a weight of each of the weight blocks is exerted on edge regions of an adjacent pair of the second packages.

In example embodiments, the method may further include forming a heat-dissipating part between the first and second packages.

Advantageous Effects

According to example embodiments of the inventive concept, weight blocks bound by a base are used to exert a pressure to top surfaces of semiconductor structures, when a reflow process is performed. This makes it possible to prevent a failure from occurring in the reflow process.

DESCRIPTION OF DRAWINGS

Example embodiments will be more clearly understood from the following brief description taken in conjunction with the accompanying drawings. The accompanying drawings represent non-limiting, example embodiments as described herein.

Figure 1:
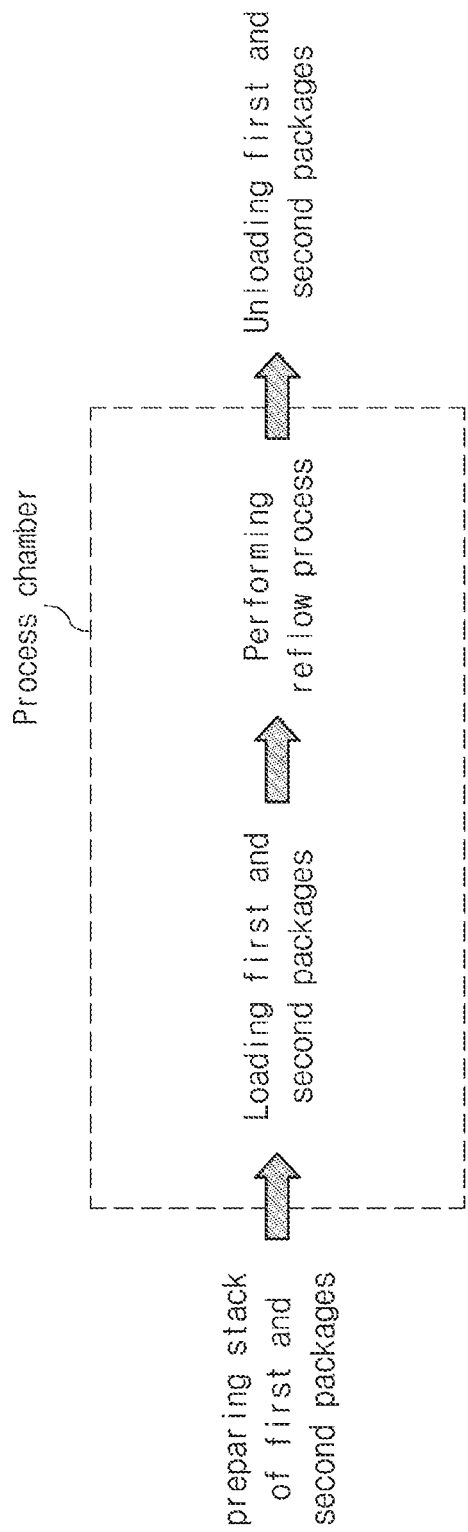
FIG. 1 is a diagram illustrating a system for manufacturing a semiconductor package, according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

MODE FOR INVENTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a diagram illustrating a system for manufacturing a semiconductor package, according to example embodiments of the inventive concept.

Referring to FIG. 1, a plurality of second packages may be stacked on a plurality of first packages, respectively. First connection patterns of each of the first packages may be in contact with second connection patterns of a corresponding one of the second packages.

The first and second packages may be loaded in a process chamber configured to perform a thermal reflow process. In example embodiments, during the thermal reflow process, the first and second connection patterns may be connected to each other, thereby forming connection structures connecting the first and second packages electrically to each other.

In other words, a package-on-package device including the second package mounted on the first package may be formed, as a result of the formation of the connection structures.

Thereafter, the package-on-package device may be unloaded from the process chamber. Although not illustrated in the drawings, during the formation of the package-on-package device, a molding part may be additionally formed to cover the package-on-package device provided with the connection structures.

Hereinafter, an apparatus for the thermal reflow process will be described in more detail.

Manufacturing Apparatus: Example Embodiments

Figure 2:
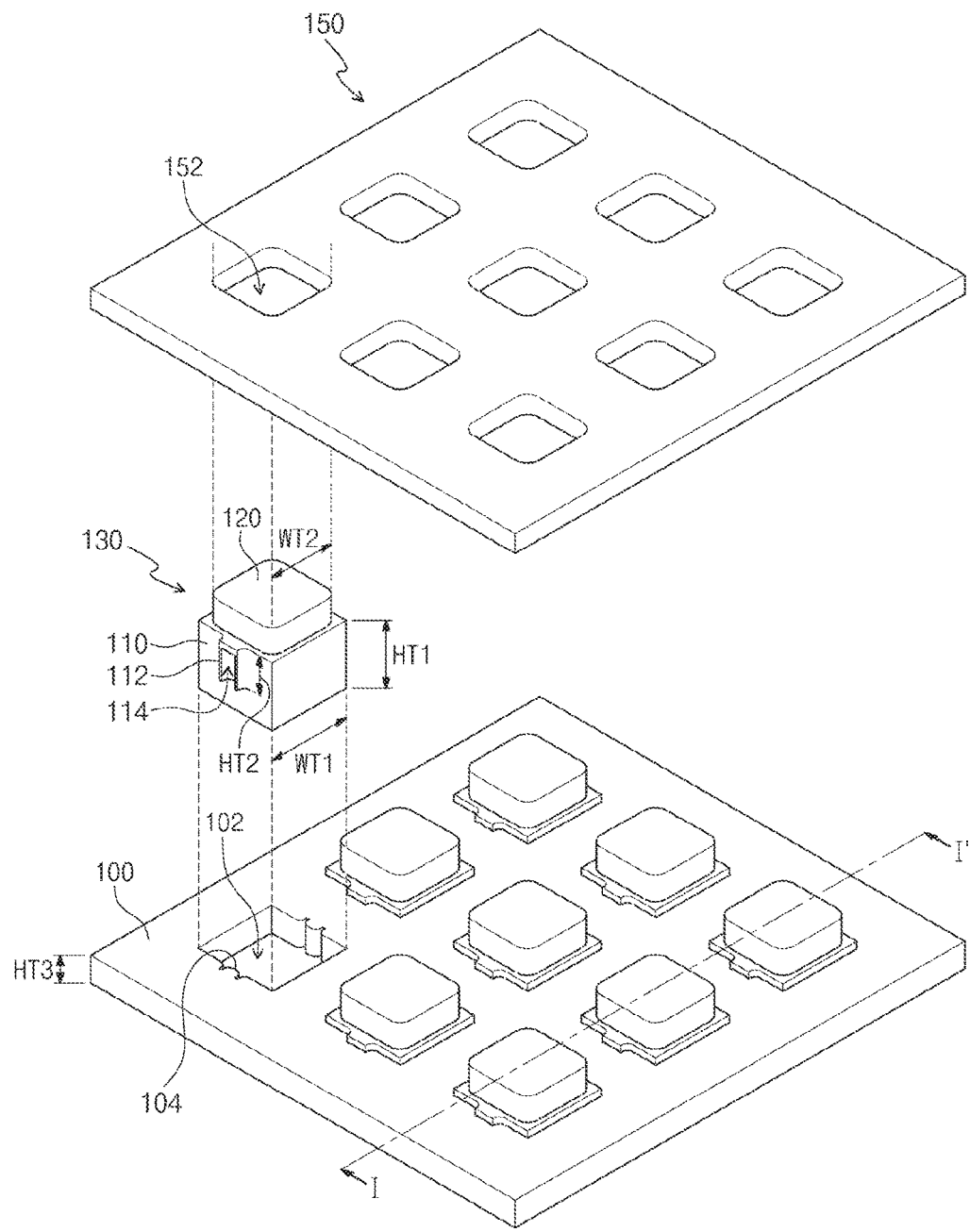
FIG. 2 is a perspective view illustrating an apparatus for manufacturing a semiconductor device, according to example embodiments of the inventive concept.
Figure 3:
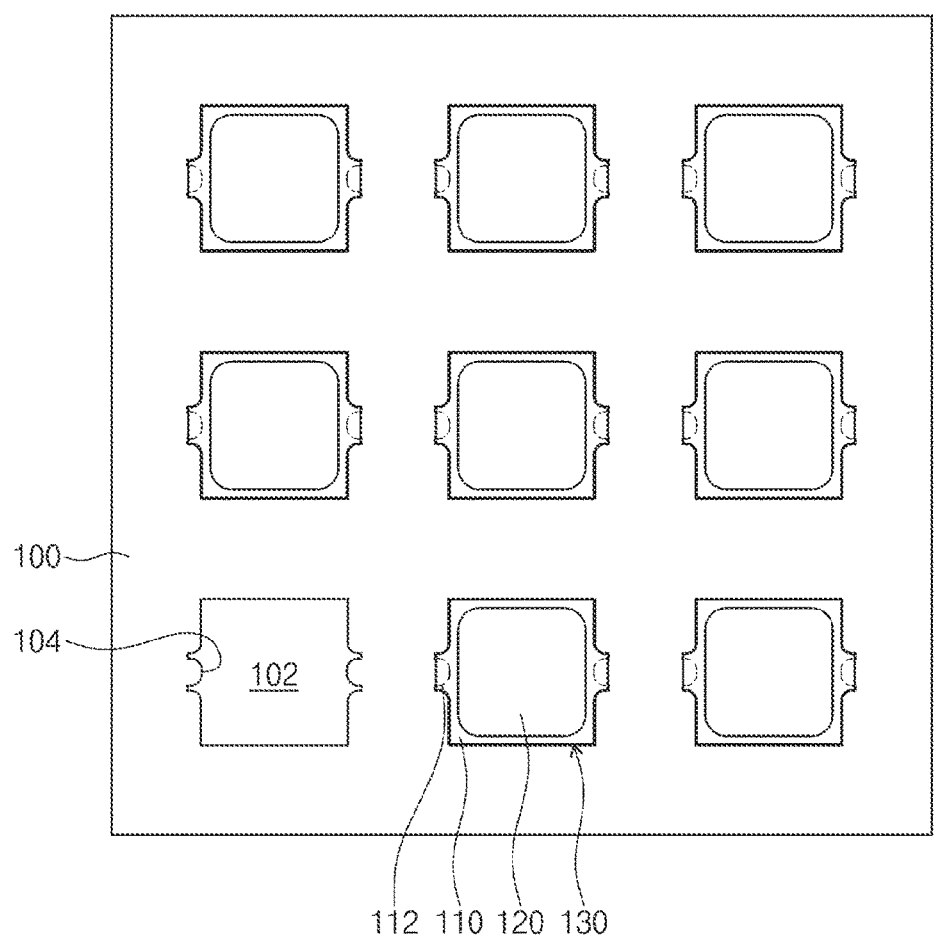
FIG. 3 is a plan view of the manufacturing apparatus of FIG. 2.
Figure 4:
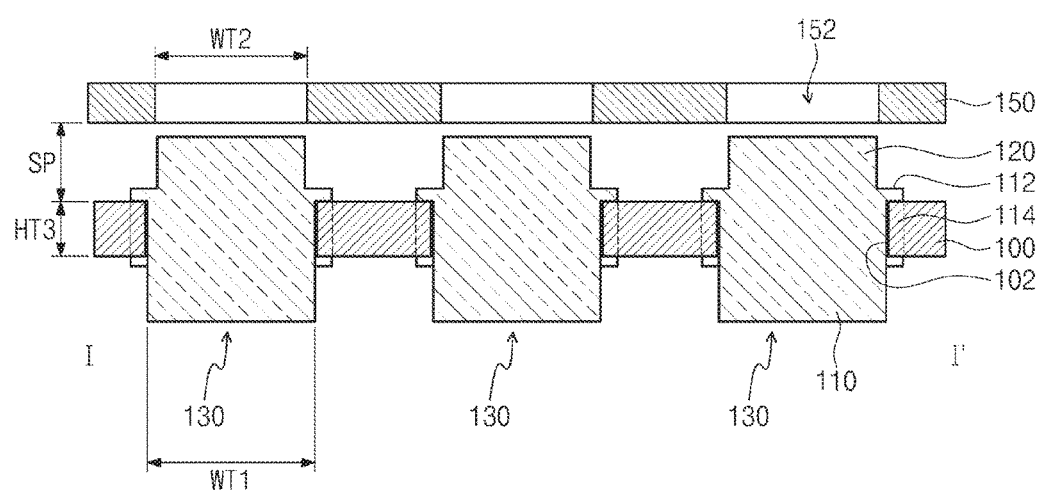
FIG. 4 is a sectional view taken along line I-I' of FIG. 2.

FIG. 2 is a perspective view illustrating an apparatus for manufacturing a semiconductor device, according to example embodiments of the inventive concept, FIG. 3 is a plan view of the manufacturing apparatus FIG. 2, and FIG. 4 is a sectional view taken along line I-I' of FIG. 2.

Referring to FIGS. 2 through 4, a manufacturing apparatus may include a base 100 and weight blocks 130.

The base 100 may be provided to have a plurality of through holes 102. The plurality of through holes 102 may be arranged spaced apart from each other in row and column directions. Each of the plurality of through holes 102 may be formed to have a shape that is the same as or similar to that of a corresponding one of the weight blocks 130. For example, when viewed in plan view, the plurality of through holes 102 may be substantially shaped like a rectangle or square.

In example embodiments, the base 100 may include a material, whose structure or shape is not changed at a temperature of about 300° C. In other words, the base 100 may include a material having a deformation-free property under a thermal process to be performed at a temperature of about 300°. For example, the base 100 may include at least one of metals, ceramics, or stainless steel. As an example, the metals for the base 100 may include aluminum, iron, copper, or carbon steel. However, the material for the base 100 is not limited to the enumerated materials.

Each of the weight blocks 130 may include a lower part 110, which is inserted into or engaged with a corresponding one of the through holes 102, and an upper part 120, which is connected to the lower part 110.

The lower parts 110 may be a hexahedral structure. The lower parts 110 may have a first width WT1. In the case where each lower part 110 has a rectangular shape in a plan view, a width thereof may be defined as the minimum distance between two opposite sides thereof. In the case where each lower part 110 has a circular shape in a plan view, a width thereof may be a diameter of such a circle. Further, each of the lower parts 110 may have a first thickness HT1.

In example embodiments, the lower part 110 may be provided to have at least one detent 112 formed on a side surface thereof. As an example, a pair of detents 112 may be formed on the opposite side surfaces of the lower part 110, respectively. In example embodiments, each of the lower parts 110 may be configured to have guide recesses 114 protruding from the side surface thereof, and the detents 112 may delimit the guide recesses 114, respectively. For example, a top surface of the detent 112 may be substantially coplanar with a top surface of the lower part 110, and the detent 112 may extend downward (i.e., toward the base 100). The detent 112 may be provided to have a second thickness HT2 that is smaller than the first thickness HT1. Further, the detent 112 may be formed to have a top-closed and bottom-open structure.

Each of the upper parts 120 may be a hexahedral structure and may be disposed to be substantially coaxial with a corresponding one of the lower parts 110. The upper part 120 may have a second width WT2 that is smaller than the first width WT1.

In example embodiments, each of the weight blocks 130 may include at least one of metals, ceramics, or stainless steel. For example, the metals for the weight blocks 130 may include aluminum, iron, copper, or carbon steel. As an example, the weight blocks 130 may be formed of or include substantially the same material as the base 100. However, the material for the weight blocks 130 is not limited to the enumerated materials.

As described above, each of the through holes 102 may be formed to have a shape that is the same as or similar to that of a corresponding one of the weight blocks 130. For example, the through holes 102 may have substantially the same section as the lower part 110 of the weight block 130. In example embodiments, the base 100 may have a plurality of protrusions 104, each of which is provided to protrude toward a center of a corresponding one of the through holes 102. In each of the through holes 102, a pair of protrusions 104 may be formed to face each other. Due to the protruding structure of the protrusions 104, a width of the through hole 102 may be smaller between the protrusions 104 than between other regions.

Further, the base 100 may have a third thickness HT3 that is smaller than the first thickness HT1. For example, the third thickness HT3 may be substantially equal to the second thickness HT2. Since the base 100 has a thickness smaller than that of the lower part 110, the lower part 110 is movable within the through hole 102.

In the case where the weight blocks 130 are inserted into or engaged with the through holes 102, the detent 112 may be locked by the protrusion 104 of the base 100, and thus, the weight blocks 130 may be bound in the through holes 102.

The manufacturing apparatus may further include a plate 150, which may be configured to restrict vertical displacements of the upper parts 120 of the weight blocks 130. The plate 150 may be provided to have a plurality of holes 152. In example embodiments, the plurality of holes 152 may correspond to the upper parts 120 of the weight blocks 130, respectively. The holes 152 may have a width that is substantially the same as or greater than that of the upper parts 120 of the weight block 130. In the case where the upper parts 120 of the weight blocks 130 are inserted into or engaged with the holes 152 of the plate 150, the weight block 130 may be bound by the plate 150, because the lower parts 110 have the width WT1 greater than that of the upper parts 120.

A distance SP between the base 100 and the plate 150 may be greater than the third thickness HT3 of the base 100. Accordingly, the weight blocks 130 can be vertically moved between the base 100 and the plate 150.

[Bottom Surface of Weight Block]

Figure 5:
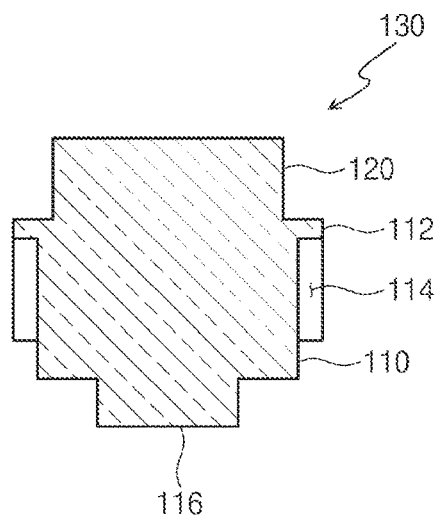
FIG. 5 is a sectional view illustrating a shape of a bottom surface of a weight block according to example embodiments of the inventive concept.
Figure 6:
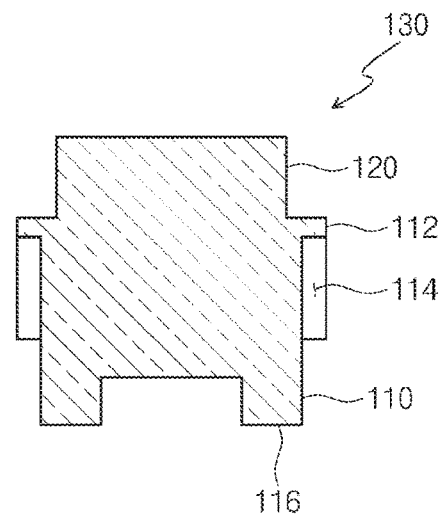
FIG. 6 is a sectional view illustrating a shape of a bottom surface of a weight block according to other example embodiments of the inventive concept.

FIG. 5 is a sectional view illustrating a shape of a bottom surface of a weight block according to example embodiments of the inventive concept, and FIG. 6 is a sectional view illustrating a shape of a bottom surface of a weight block according to other example embodiments of the inventive concept.

Referring to FIGS. 5 and 6, a bottom surface 116 of the weight block 130 may be in contact with a pressure-applying surface. The bottom surface 116 of the weight block 130 may have an area that is substantially equal to or smaller than that of the pressure-applying surface. In certain embodiments, the pressure-applying surface may be a top surface of a semiconductor package or chip.

The weight block 130 may be configured to include a protrusion. In example embodiments, as shown in FIG. 5, the protrusion may be formed on a center region of the bottom surface 116 of the weight block 130. In other example embodiments, as shown in FIG. 6, the protrusion may be formed on an edge region of the bottom surface 116 of the weight block 130. However, the shape of the bottom surface 116 of the weight block 130 is not limited to the examples of FIGS. 5 and 6.

Manufacturing Apparatus: Other Example Embodiments

Figure 7:
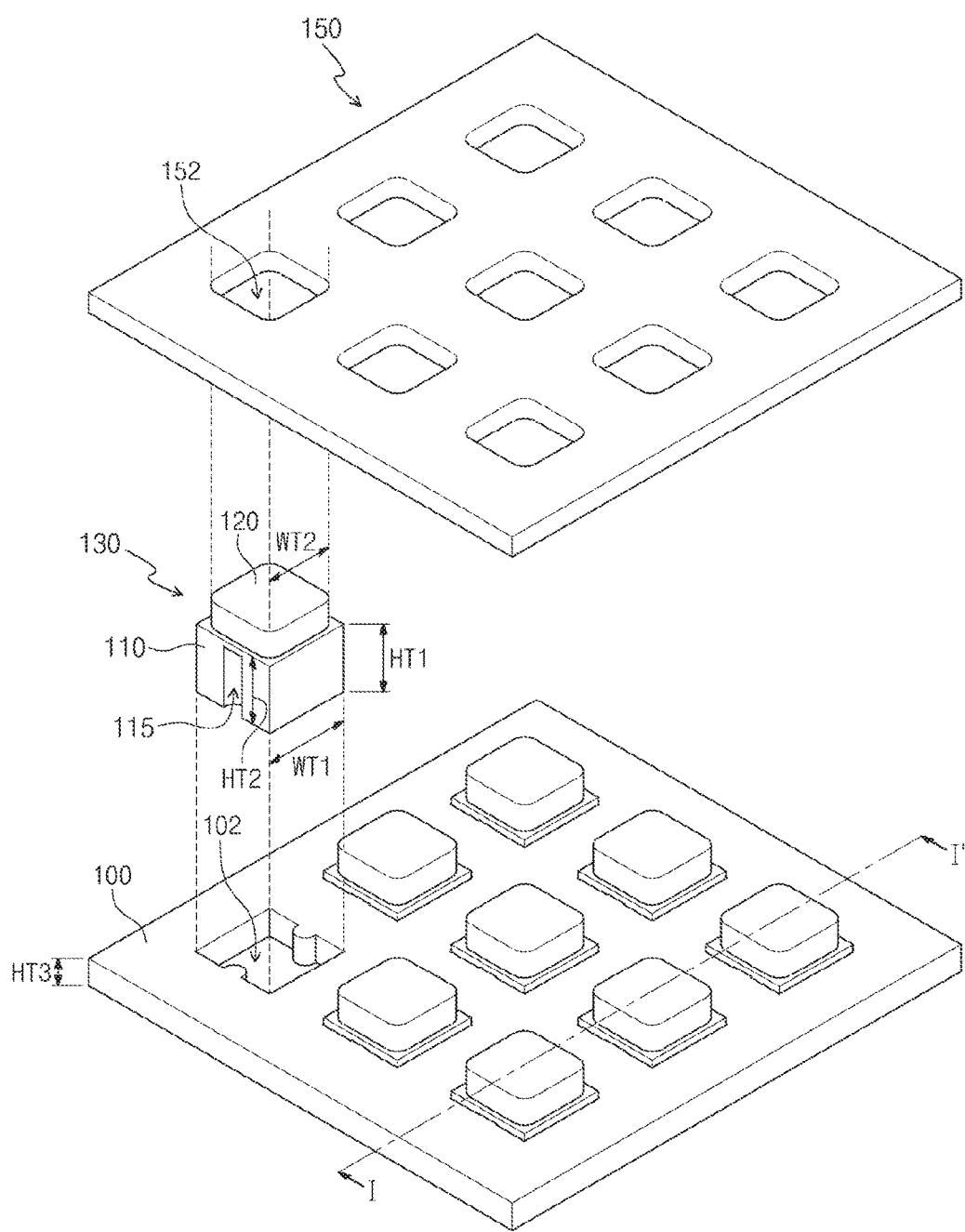
FIG. 7 is a perspective view illustrating an apparatus for manufacturing a semiconductor device, according to other example embodiments of the inventive concept.
Figure 8:
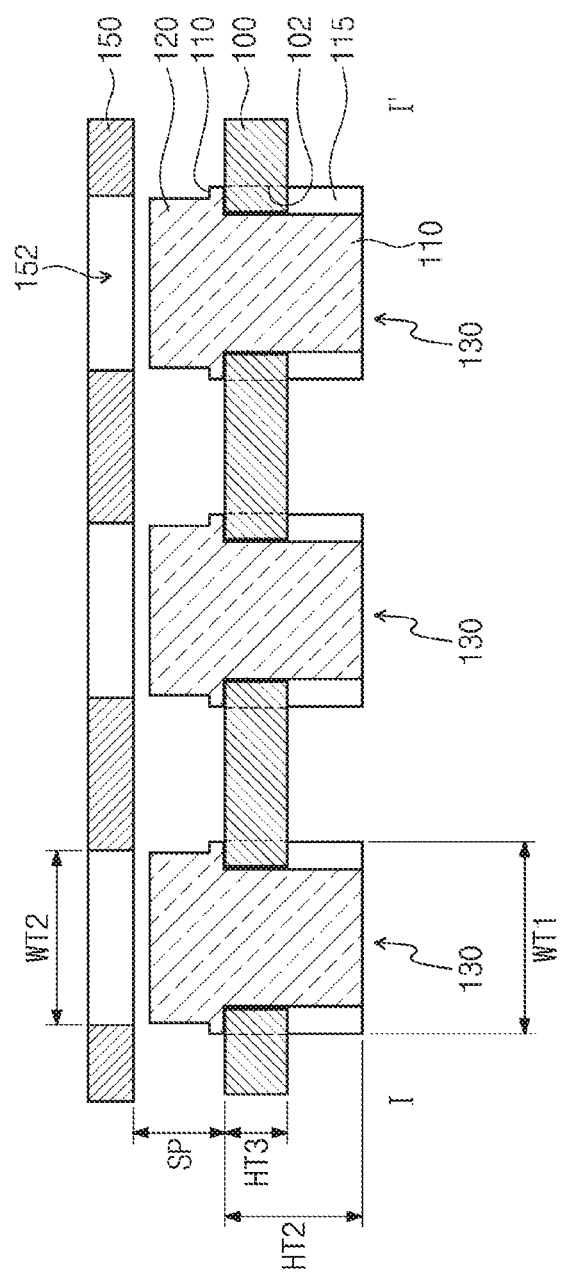
FIG. 8 is a sectional view taken along line I-I' of FIG. 7.

FIG. 7 is a perspective view illustrating an apparatus for manufacturing a semiconductor device, according to other example embodiments of the inventive concept, and FIG. 8 is a sectional view taken along line I-I' of FIG. 7. For concise description, a previously described element may be identified by a similar or identical reference number without repeating an overlapping description thereof Referring to FIG. 7 and FIG. 8, a manufacturing apparatus may include a base 100 and weight blocks 130. Further, the manufacturing apparatus may further include a plate 150, which may be configured to restrict vertical displacements of the weight blocks 130.

The base 100 may be provided to have a plurality of through holes 102. Each of the weight blocks 130 may include a lower part 110 and an upper part 120. The lower part 110 may be inserted into or engaged with a corresponding one of the through holes 102, and the upper part 120 may be connected to the lower part 110.

The lower parts 110 may be a hexahedral structure. The lower parts 110 may have a first width WT1. In the case where each lower part 110 has a rectangular shape in a plan view, a width thereof may be defined as the shortest distance between two opposite sides thereof. In the case where each lower part 110 has a circular shape in a plan view, a width thereof may be a diameter of such a circle. The lower parts 110 may have a first thickness HT1.

In example embodiments, the lower part 110 may be provided to have at least one recessed region 115 formed on a side surface thereof. In the present embodiments, the recessed regions 115 may be respectively formed on centers of opposite side surfaces of the lower part 110, and thus, a width of the lower part 110 is smaller between recessed regions 115 than between the remaining regions. The recessed region 115 may have a second thickness HT2 that is smaller than the first thickness HT1. The recessed region 115 may be formed to penetrate a bottom surface of the lower part 110 and be spaced apart from a top surface of the lower part 110. The recessed region 115 may be formed to have a bottom-open and top-closed structure. Since the recessed region 115 is formed at a lower portion of the lower part 110, an upper portion of the lower part 110 may have a protrusion. The protrusion may have substantially the same function as the detent 112 described with reference to FIGS. 2 through 4.

In example embodiments, a pair of recessed regions 115 may be formed on each lower part 110. The pair of recessed regions 115 may be formed to face each other.

The remaining elements of the manufacturing apparatus of FIGS. 7 and 8 may be configured to have substantially the same features as those of FIGS. 2 through 4, and thus, for concise description, overlapping description of such elements will be omitted.

Further, the lower part 110 may be configured to have substantially the same structure as those described with reference to FIGS. 5 and 6.

Manufacturing Apparatus: Still Other Example Embodiments

Figure 9:
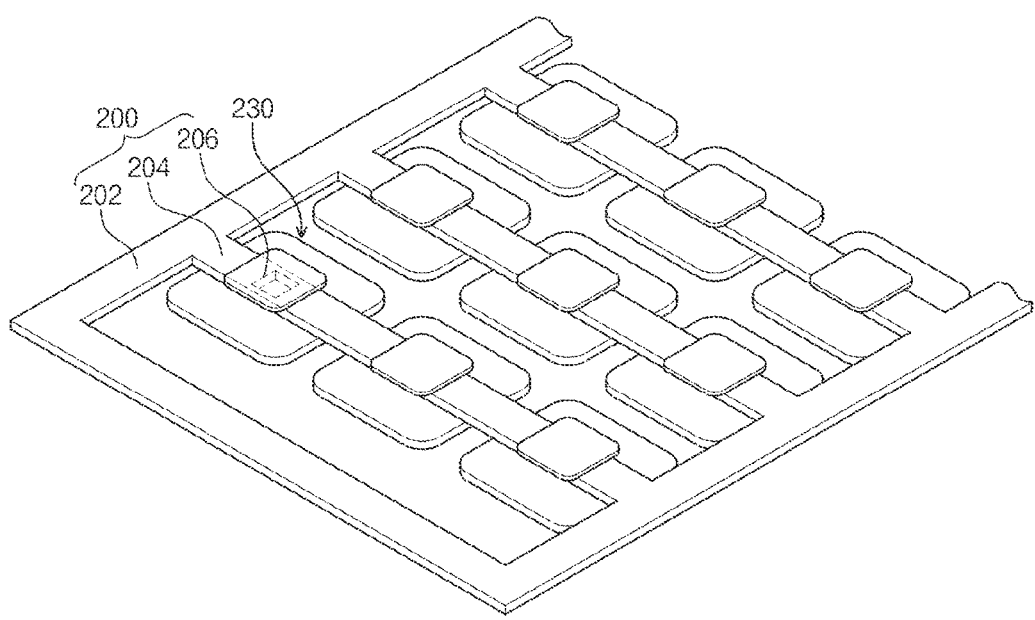
FIG. 9 is a perspective view illustrating an apparatus for manufacturing a semiconductor device, according to still other example embodiments of the inventive concept.
Figure 10:
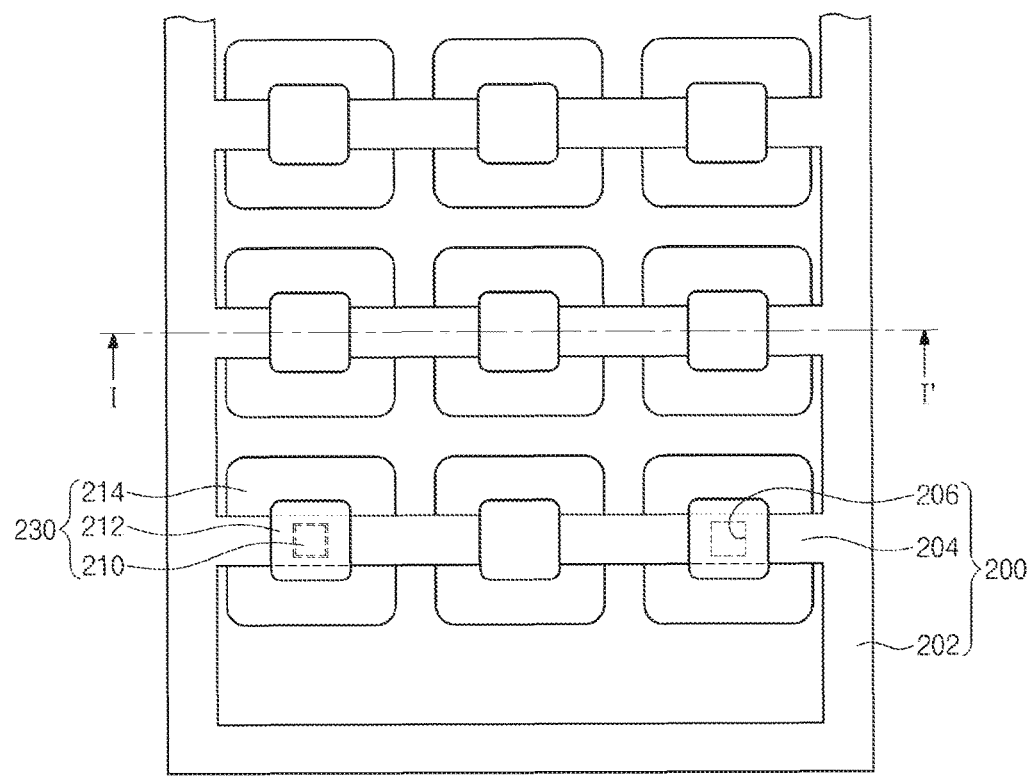
FIG. 10 is a plan view of the manufacturing apparatus of FIG. 9.
Figure 11:
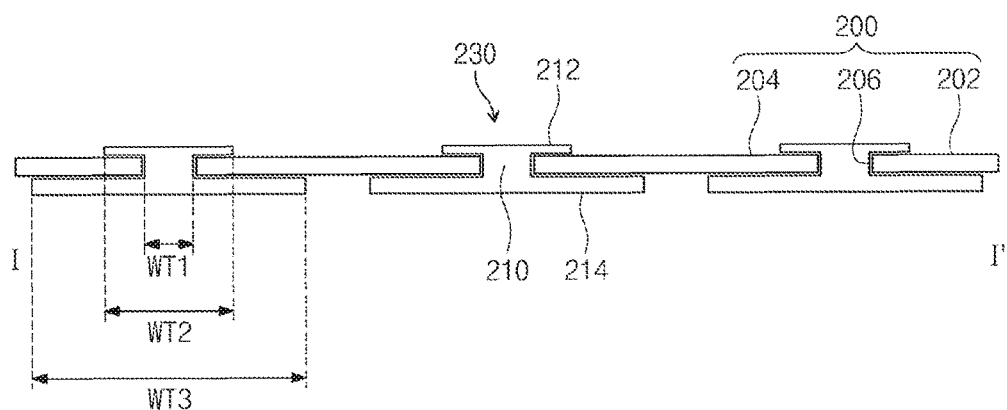
FIG. 11 is a sectional view taken along line I-I' of FIG. 10.

FIG. 9 is a perspective view illustrating an apparatus for manufacturing a semiconductor device, according to still other example embodiments of the inventive concept, FIG. 10 is a plan view of the manufacturing apparatus FIG. 9, and FIG. 11 is a sectional view taken along line I-I' of FIG. 10.

Referring to FIGS. 9 through 11, a manufacturing apparatus may include a base 200 and weight blocks 230.

The base 200 may include an outer portion 202 and a plurality of connecting portions 204. The outer portion 202 may be a rectangle-shaped structure with two pairs of opposite bars, and each of the connecting portions 204 may be disposed to connect each pair of opposite bars of the outer portion 202 to each other. In example embodiments, the connecting portions 204 may be disposed to be parallel to each other. In certain embodiments, the connecting portions 204 may be disposed to cross each other orthogonally.

A plurality of through holes 206 may be formed through each of the connecting portions 204. The through holes 206 may be formed to have substantially the same shape as the weight blocks 230.

Each of the weight blocks 230 may include a vertical part 210 penetrating a corresponding one of the through holes 206, an upper part 212 connected to a top of the vertical part 210, and a lower part 214 connected to a bottom of the vertical part 210. As an example, the vertical part 210 may have a first width WT1, the upper part 212 may have a second width WT2 greater than the first width WT1, and the lower part 214 may have a third width WT3 that is greater than the first width WT1. For example, as shown in FIG. 11, the second and third widths WT2 and WT3 may be greater than a width of the through hole 206, and the second width WT2 may be smaller than the third width WT3. Here, as shown in FIG. 11, the first to third widths WT1, WT2, and WT3 may be horizontal lengths of the vertical, upper, and lower parts 210, 212, and 214, which are measured along a direction parallel to the top surface of the base 200. As an example, in the case where the weight block 230 has a circular shape in a plan view, the first to third widths WT1, WT2, and WT3 may be diameters of the vertical, upper, and lower parts 210, 212, and 214, respectively. As another example, in the case where the weight block 230 has a rectangular shape in a plan view, the first to third widths WT1, WT2, and WT3 may be distances between opposite side surfaces of the vertical, upper, and lower parts 210, 212, and 214.

Since both of the upper and lower parts 212 and 214 are wider than the through hole 206, the weight block 230 may be bound by the base 200. In other words, a vertical displacement of each weight block 230 may be restricted by the base 200.

Except for the above features, other elements of the base 200 and the weight blocks 230 may be configured to have substantially the same or similar features as that of FIGS. 2 through 4, and thus, for concise description, overlapping description of such elements will be omitted. Further, the weight blocks 230 may be configured in such a way that bottom surfaces thereof have the same structure as that described with reference to FIGS. 5 and 6, and thus, a detail description thereof will be omitted.

Hereinafter, a method of manufacturing a semiconductor package using the manufacturing apparatus will be described.

[Method of Manufacturing Semiconductor Package]

Figure 12:
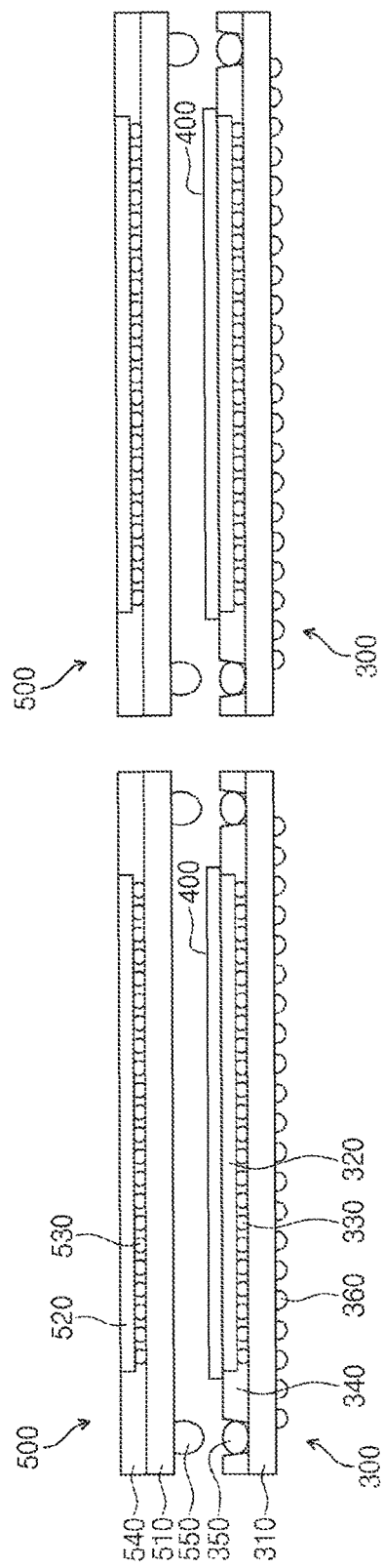
FIGS. 12, 13, 14, and 15 are sectional views illustrating a method of fabricating a semiconductor package, according to example embodiments of the inventive concept.
Figure 13:
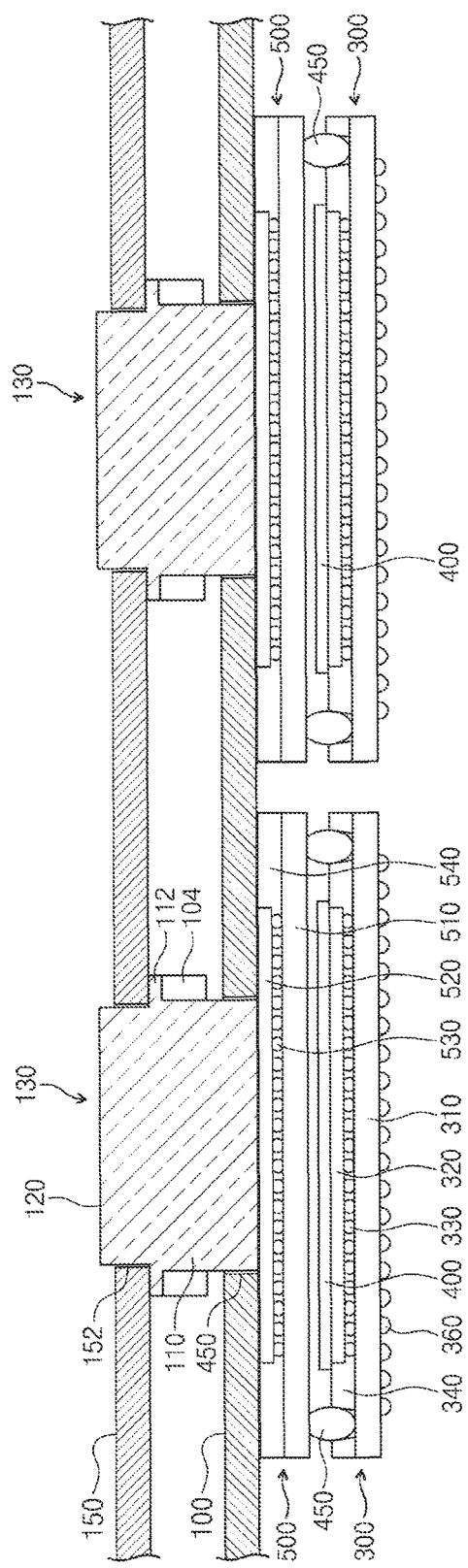
Figure 14:
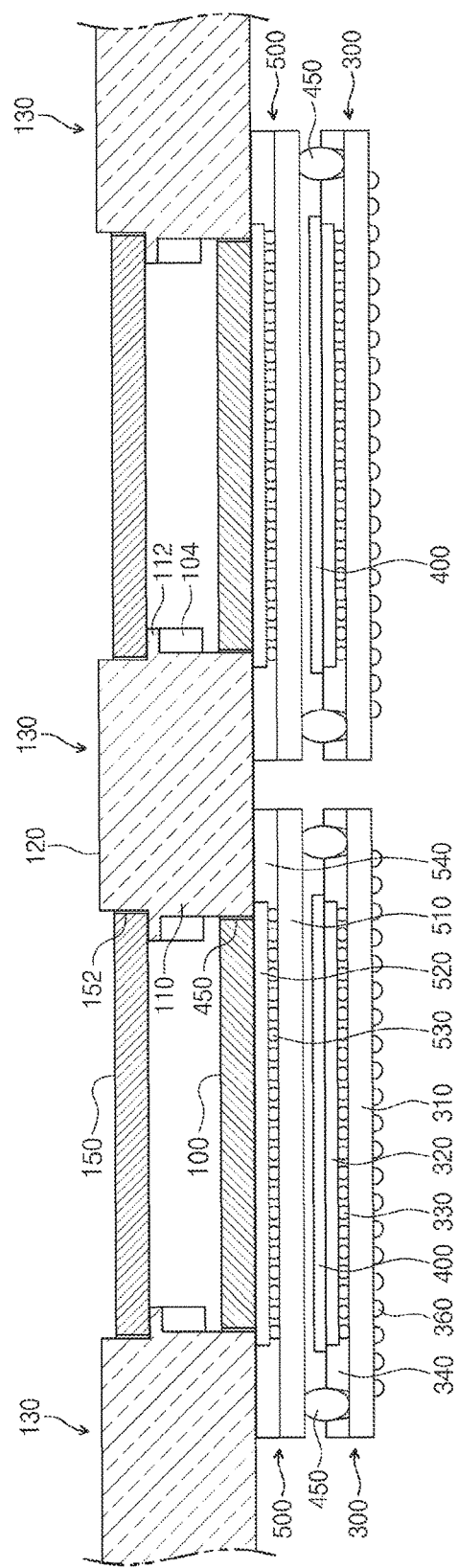

FIGS. 12, 13, 14 and 15 are sectional views illustrating a method of fabricating a semiconductor package, according to example embodiments of the inventive concept. Here, FIGS. 13 and 14 illustrate two examples of a method of fabricating a semiconductor package using a manufacturing apparatus, according to example embodiments of the inventive concept.

Referring to FIGS. 1 and 12, a plurality of second packages 500 may be disposed on a plurality of first packages 300, respectively.

In example embodiments, each of the first packages 300 may include a first substrate 310. Each of the first packages 300 may further include a first semiconductor chip 320 and first connection patterns 350, which are mounted on the first substrate 310. The first semiconductor chip 320 may be electrically connected to a top surface of the first substrate 310 via first bumps 330. The first semiconductor chip 320 may be disposed on a center region of the first substrate 310, and the first connection patterns 350 may be disposed on a top edge region of the first substrate 310. In certain embodiments, each of the first packages 300 may further include a first molding part 340 and a plurality of outer terminals 360. The first molding part 340 may be configured to protect the first semiconductor chip 320 against any external attack. The outer terminals 360 may be provided on a bottom surface of the first substrate 310.

Each of the second packages 500 may include a second substrate 510. Each of the second packages 500 may further include a second semiconductor chip 520 and second connection patterns 550 mounted on the second substrate 510. The second semiconductor chip 520 may be electrically connected to a top surface of the second substrate 510 via second bumps 530. The second connection patterns 550 may be disposed on a bottom surface of the second substrate 510. Further, the second connection patterns 550 may be provided at positions corresponding to the first connection patterns 350. In other words, when viewed in plan view, the second connection patterns 550 may be located at positions overlapped with the first connection patterns 350, respectively. In certain embodiments, each of the second packages 500 may further include a second molding part 540 for protecting the second semiconductor chip 520 against any external attack.

The semiconductor package may further include a heat-dissipating part 400 disposed between the first package 300 and the second package 500. For example, the heat-dissipating part 400 may be provided between the first semiconductor chip 320 of the first package 300 and the second substrate 510 of the second package 500. The heat-dissipating part 400 may be formed of or include a thermal interface material (TIM).

According to example embodiments of the inventive concept, the disposition of the first packages 300 on the second packages 500 may be performed in such a way that the first connection patterns 350 of each of the first packages 300 are in contact with the second connection patterns 550 of a corresponding one of the second packages 500.

In certain cases, owing to the heat-dissipating part 400, at least one of the first connection patterns 350 may be not in contact with the second connection patterns 550. Also, due to an increasing demand for a thin semiconductor package, it is necessary to reduce a thickness of one or both of the first and second substrates 310 and 510. In this case, one or both of the first and second substrates 310 and 510 may be unintentionally bent; that is, there may be a substrate warpage. Such a substrate warpage may also prevent at least one of the first connection patterns 350 from being in contact with the second connection patterns 550.

According to example embodiments of the inventive concept, to avoid the incomplete contact between the first and second connection patterns 350 and 550, a thermal reflow process may be performed on the stack of the first and second packages 300 and 500. For example, as shown in FIG. 1, the stack of the first and second packages 300 and 500 may be loaded in the process chamber. Further, the base 100 with the weight blocks 130 may be provided in the process chamber and may be disposed on the stack of the first and second packages 300 and 500.

In example embodiments, as shown in FIG. 13, the weight blocks 130 may be disposed in such a way that each of them is in contact with a corresponding one of the second packages 500. The weight blocks 130 may exert a pressure on the second packages 500, respectively. In example embodiments, a magnitude of the pressure exerted from the weight block 130 may be dependent on or proportional to a weight of the weight block 130. The weight block 130 may be disposed in such a way that a bottom surface thereof is in contact with a center region of a top surface of the second package 500. As described above, the bottom surface of the weight block 130 may be configured to have a protrusion at a center or edge region thereof. Here, the weight block 130 may be disposed in such a way that the protrusion thereof is in contact with the top surface of the second package 500.

In other example embodiments, as shown in FIG. 14, each of the weight blocks 130 may be disposed in such a way that each of them is in common contact with edge regions of an adjacent pair of the second packages 500. Here, each of the weight blocks 130 may exert substantially the same pressure on the adjacent pair of the second packages 500, and a magnitude of the pressure exerted from the weight block 130 may be dependent on or proportional to a weight of the weight block 130. The weight block 130 may be disposed in such a way that a bottom surface thereof is in contact with an edge region of a top surface of the second package 500. As described above, the bottom surface of the weight block 130 may be configured to have a protrusion at a center or edge region thereof. Here, the weight block 130 may be disposed in such a way that the protrusion thereof is in contact with the top surface of the second package 500.

Since the weight blocks 130 are disposed to be in contact with the second packages 500, a weight or gravity load of the weight block 130 can be exerted on the second package 500.

Referring to FIG. 1, the thermal reflow process may be performed on the first and second connection patterns 350 and 550, when the weight of or the pressure from the weight block 130 is exerted on the second packages 500. The reflow thermal treatment process may be performed at a high temperature of about 300° C. or higher. In this case, due to an environment of such a high temperature, the first and second connection patterns 350 and 550 in contact with each other may be melted and connected to each other with good wetting property, thereby forming the connection structure 450.

The weight or gravity load exerted from the weight block 130 may allow for close contact between the first and second connection patterns 350 and 550, and this makes it possible to realize a good wetting of an interface between the first and second connection patterns 350 and 550. This allows for improvement in electric reliability of the connection structures 450.

Figure 15:
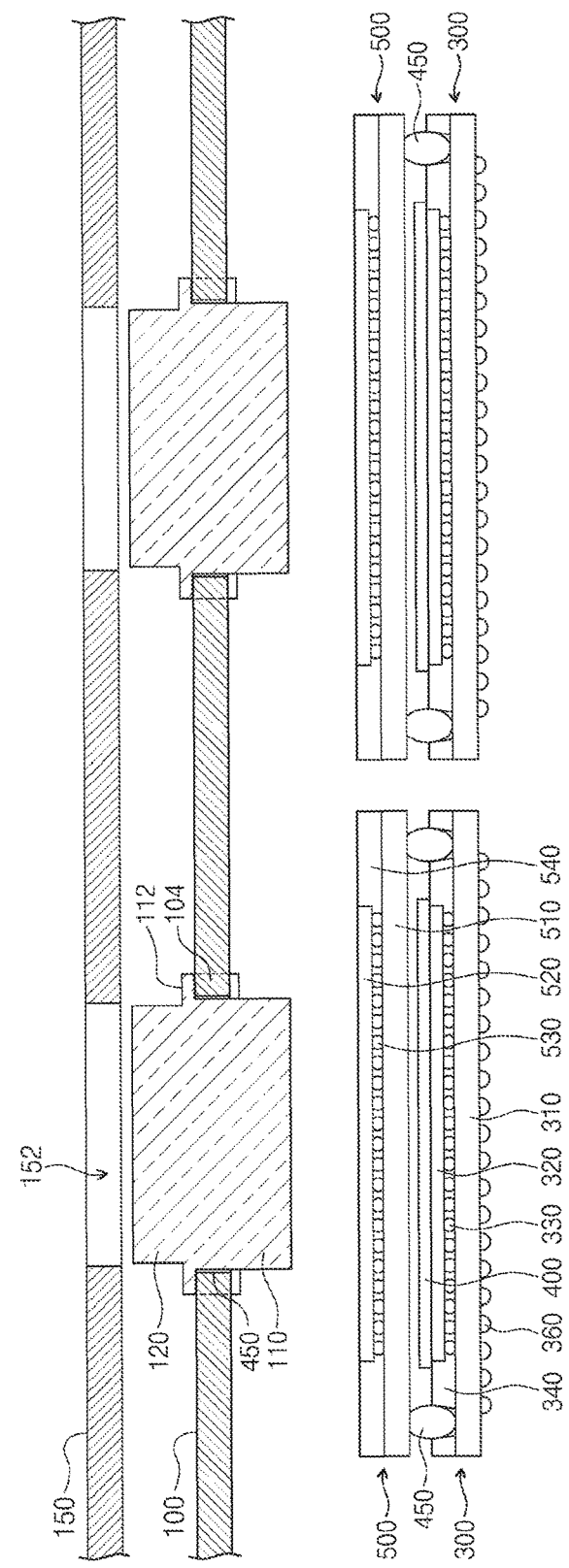

Referring to FIGS. 1 and 15, after the formation of the connection structures 450, the base 100 may be moved in such a way that the weight blocks 130 are separated from the second packages 500. First and second packages 300 and 500, which are electrically and physically connected to each other via the connection structures 450, may be unloaded from the process chamber.

While example embodiments of the inventive concepts have been particularly shown and described, it will be understood by one of ordinary skill in the art that variations in form and detail may be made therein without departing from the spirit and scope of the attached claims.

The invention claimed is:

1. An apparatus for manufacturing a semiconductor device, comprising:
   a base with a plurality of through holes; and
   weight blocks bound by the through holes, respectively, the weight blocks being configured to apply pressure to a surface of the semiconductor device during a reflow process, the weight blocks being configured to be vertically movable in corresponding through holes;
   wherein each of the weight blocks comprises:
      a lower part configured to be vertically movable in a corresponding one of the through holes; and
      an upper part extending from the lower part;
   wherein the lower part has a vertical length that is greater than a length of the corresponding one of the through holes.

2. The apparatus of claim 1, wherein the lower part of each of the weight blocks comprises a detent formed on a side surface thereof, and
   the base comprises lateral protrusions, each of which protrudes toward a center of a corresponding one of the through holes,
   wherein the weight blocks are engaged with the through holes, respectively, by the detents and the lateral protrusions.

3. The apparatus of claim 1, wherein the lower part of each of the weight blocks comprises a recessed region formed on a side surface thereof to have a bottom-open and top-closed structure.

4. The apparatus of claim 3, wherein the recessed region has a thickness that is smaller than a thickness of the lower part of each of the weight blocks.

5. The apparatus of claim 1, further comprising a plate with holes, in which the upper parts of the weight blocks are disposed.

6. The apparatus of claim 1, wherein each of the weight blocks has a bottom surface to be in direct contact with the surface of the semiconductor device, and
   the bottom surface of each of the weight blocks is configured to have a protrusion at a center region thereof.

7. The apparatus of claim 1, wherein each of the weight blocks has a bottom surface to be in direct contact with a pressure-applying surface, and
   the bottom surface of each of the weight blocks is configured to have a protrusion at an edge region thereof.

8. The apparatus of claim 1, wherein the base comprises a material having a deformation-free property under a thermal process to be performed at a temperature of about 300° C.

9. A method of manufacturing a semiconductor package, comprising:
   preparing first packages, each of which comprises first connection patterns;
   disposing second packages on the first packages, respectively, each of the second packages comprising second connection patterns at positions corresponding to the first connection patterns;
   disposing a base with weight blocks, on the second packages wherein each of the weight blocks comprises a lower part configured to be vertically movable in a corresponding one of the through holes, and an upper part extending from the lower part wherein the lower part has a vertical length that is greater than a length of the corresponding one of the through holes, and a bottom surface of each of the weight blocks having a protrusion;
   applying a pressure to all of the second packages using the weight blocks; and
   performing a reflow process on the first and second connection patterns to form a connection structure electrically connecting the first and second packages to each other.

10. The method of claim 9, wherein the applying of the pressure to the second packages is performed in such a way that a weight of each of the weight blocks is exerted on a central region of a corresponding one of the second packages.

11. The method of claim 9, wherein the applying of the pressure to the second packages is performed in such a way that a weight of each of the weight blocks is exerted on edge regions of an adjacent pair of the second packages.

12. The method of claim 9, further comprising forming a heat-dissipating part between the first and second packages.

* * * * *